United States Patent [19]

Eitan

[11] Patent Number: 4,639,893
[45] Date of Patent: Jan. 27, 1987

[54] SELF-ALIGNED SPLIT GATE EPROM
[75] Inventor: Boaz Eitan, Sunnyvale, Calif.
[73] Assignee: Wafer Scale Integration, Inc., Fremont, Calif.
[21] Appl. No.: 610,369
[22] Filed: May 15, 1984
[51] Int. Cl.[4] .............................................. G11C 11/40
[52] U.S. Cl. .................................... 365/185; 357/23.1
[58] Field of Search ............... 365/185, 189; 357/23.1, 357/23.14

[56] References Cited
U.S. PATENT DOCUMENTS
4,274,012  6/1981  Simko ..................................... 365/185
4,412,311  10/1983 Miccoli et al. ......................... 365/185

Primary Examiner—Terrell W. Fears
Attorney, Agent, or Firm—Alan H. MacPherson; Steven F. Caserza; Richard Franklin

[57] ABSTRACT

A self-aligned split gate single transistor memory cell structure is formed by a process which self aligns the drain region to one edge of a floating gate. The portion of the channel underneath the floating gate is accurately defined by using one edge of the floating gate to align the drain region. The control gate formed over the floating gate controls the portion of the channel region between the floating gate and the source to provide split gate operation. The source region is formed sufficiently far from the floating gate so that the channel length between the source region and the closest edge of the floating gate is controlled by the control gate but does not have to be accurately defined.

7 Claims, 13 Drawing Figures $V_{TX}$
(THRESHOLD VOLTAGE)

$V_{DTO}$
(DRAIN TURN-ON VOLTAGE)

SELF-ALIGNED SPLIT GATE EPROM

BACKGROUND OF THE INVENTION

1. Field of the Invention

This invention relates to a nonvolatile EPROM and more particularly to such an EPROM having a split gate (i.e., both a floating gate and a control gate) for controlling the writing and reading of each cell wherein the floating gate is self-aligned with the drain and the channel underlying the floating gate and the control gate is not self-aligned.

2. Prior Art

A split gate nonvolatile EPROM with increased efficiency is disclosed in U.S. Pat. No. 4,328,565 issued May 4, 1982 on an application of Harari, filed Apr. 7, 1980. As disclosed by Harari, the floating gate in an n channel EPROM cell extends over the drain diffusion and over a portion of the channel thereby to form a "drain" capacitance between the drain and the floating gate and a "channel" capacitance between the channel and the floating gate. A control gate then overlaps the floating gate and extends over the remainder of the channel near the source diffusion thereby to form a "control" capacitance between the floating gate and the control gate. These three capacitances form the coupling for driving each cell. The inversion region in the channel directly under the control gate is established directly by a "write or read access" voltage applied to the control gate. The inversion region in the channel directly under the floating gate is established indirectly through the drain and control capacitances and the channel capacitance by the control gate voltage and by another write access voltage applied to the drain. A cell is erased either by ultraviolet illumination or by electrons from the floating gate tunneling through a region of thinned oxide. The nonsymmetrical arrangement of the control gate and floating gate with respect to source and drain allows a very dense array implementation. Other split gate structures are disclosed in an article by Barnes, et al. entitled "Operation and Characterization of N-Channel EPROM Cells", published in Solid State Electronics, Vol. 21, pages 521-529 (1978) and an article by Guterman, et al. entitled "An Electrically Alterable Nonvolatile Memory Cell Using a Floating-Gate Structure", published in the IEEE Journal of Solid-State Circuits, Vol. SC-14, No. 2, Apr. 1979.

FIG. 1 illustrates a typical EPROM of the prior art. In FIG. 1 a memory cell comprises n++ source region 11a and n++ drain region 11b separated by channel region 16. Channel region 16 has an effective length $L_{eff}$ as shown. Overlying channel region 16 is gate dielectric 12 on which is formed a floating gate 13. Typically floating gate 13 is formed of polycrystalline silicon. Overlying floating gate 13 is insulation 14, typically thermally grown silicon dioxide. Control gate 15 is formed above floating gate 13 on insulation 14. The state of the transistor in FIG. 1 is determined by the charge placed on floating gate 13. When electrons are placed on floating gate 13, the threshold voltage $V_{tx}$ required on gate 15 to turn on the transistor (i.e., to form an n channel between source 11a and drain 11b thereby allowing current to flow from one to the other) is much greater than when no electrons are placed on floating gate 13. As shown in FIG. 1, regions 13a and 13b of floating gate 13 overlie the source 11a and drain 11b, respectively, by a small amount "Δ". Consequently, a capacitance is formed between the source 11a and floating gate region 13a and between the drain 11b and floating gate region 13b. If the overlap by gate 13 of the source 11a and the drain 11b is the amount "Δ", then the capacitance $C_{pp}$ between the floating gate 13 and the control gate 15 (both made of polycrystalline silicon) is given by the following equation:

$$C_{pp} \alpha A_{pp} \alpha W(L_{eff} + 2\Delta_{FG,D}) \tag{1}$$

In equation 1, $C_{pp}$ is the capacitance between the floating gate 13 and the overlying control gate 15 (this capacitance is proportional to $A_{pp}$) and $A_{pp}$, the area of the floating gate 13, is just the width W of the floating gate 13 (perpendicular to the sheet of the drawing) times the length of the floating gate 13 which is $(L_{eff} + 2\Delta_{FG,D})$.

The capacitance $C_{PROM}$ between the floating gate 13 and the substrate 10 is proportional to the effective width $W_{eff}$ (i.e. the width perpendicular to the sheet of the paper of the active area underneath the floating gate 13) of the floating gate 13 times $L_{eff}$. Thus the capacitance $C_{PROM}$ is $$C_{PROM} \alpha A_{PROM} \alpha W_{eff}(L_{eff}) \tag{2}$$

The capacitive coupling $C_{FG,D}$ of the floating gate 13 to the drain 11b is given by $$C_{FG,D} \alpha A_{FG,D} \alpha W_{eff}(\Delta_{FG,D}) \tag{3}$$

The coupling ratio $CR_{FG,D}$ of the capacitive coupling $C_{FG,D}$ of the floating gate 13 to drain 11b to the capacitive coupling $C_{pp}$ of the floating gate 13 to the control gate 15 and the capacitive coupling $C_{PROM}$ of the floating gate 13 to the substrate 10 is $$CR_{FG,D} \alpha W_{eff}(\Delta_{FG,D})/[W_{eff}(L_{eff}) + W(L_{eff} + 2\Delta_{FG,D})] \tag{4}$$

As $L_{eff}$ becomes smaller and smaller the impact of the coupling of the drain on the performance of the PROM cell becomes greater and greater until in the limit, as $L_{eff}$ becomes very, very small, this coupling approaches 0.3 (taking into account different oxide thicknesses and the difference between W and $W_{eff}$, for example). The overlay "Δ" depends on the process and is substantially fixed.

FIG. 2 shows the prior art split gate structure as illustrated by Harari in U.S. Pat. No. 4,328,565 issued May 4, 1982. The major concern in this structure relates to the length of portion 26b of channel 26 beneath floating gate 23. The structure of FIG. 2 is a nonself-aligned split gate structure. The total effective channel length 26 is defined by one mask and therefore is constant. Unfortunately, the length of the portion 26b of channel 26 beneath the floating gate 23 varies with mask alignment tolerances. Thus the effective channel length 26b depends strongly on the alignment process. As a result the best technology available today yields an effective tolerance of channel length 26b no better than ±0.5 to ±0.6 microns. For a typical nominal one micron effective channel length 26b the actual channel length will vary, due to manufacturing tolerances, over the range of about 1 ±0.6 micron. The result is a very wide variation in performance from one transistor memory cell to the next. Programming and read current are both very sensitive to channel length. Good cells will be perfect but bad cells will not work. A good device has an effective channel 26b (in one embodiment 0.8 microns) which lies between a too-short channel length (for example 0.2 microns or less, so that considering manufacturing variations there may not be any overlap at all of floating gate 23 over the channel 26 and thus there will be no programming of the cell) and a too-long channel length (for example greater than 1.4 microns) with unacceptably slow programming. The major issue in this prior art structure thus is the length of channel portion 26b ($L_{eff}$) rather than the coupling. Therefore in a structure such as that shown in FIG. 2 there can be coupling between drain 21b and floating gate 23 but if the channel length 26b is not carefully controlled, the memory cell is not going to perform as expected.

A major problem in the prior art EPROM of FIG. 1 relates to the relationship between the program threshold voltage $V_{tx}$ and the drain turn on voltage $V_{DTO}$ of the device. $V_{DTO}$ is the voltage on the drain which, when capacitively coupled to the floating gate 13, turns on the transistor. As shown in FIG. 4, for $L_{eff}$ as shown in FIG. 1 increasing from about 0.5 to 1.2 microns, the program threshold $V_{tx}$ drops below the acceptable program threshold. On the other hand the drain turn-on voltage $V_{DTO}$ becomes as high as the junction breakdown voltage for $L_{eff}$ greater than about one micron. Below one micron, $V_{DTO}$ is very low and may go as low as three to five volts which causes the array of EPROMS to fail. The crossover point is shown as "A" in FIG. 4. In designing a regular EPROM, the crossover point A should be such that $V_{tx}$ is high enough (i.e. greater than five volts) while $V_{DTO}$ is not too low (i.e. not lower than eight volts). However, both curves $V_{DTO}$ and $V_{tx}$ are quite steep at the crossover point A and thus the characteristics of the device are very sensitive to $L_{eff}$. So if the tolerance on $L_{eff}$ is even ±0.3 microns, which is very good, then the characteristics of the device are still relatively unpredictable. Obviously the desired solution is to eliminate the effect of $V_{DTO}$ and optimize $L_{eff}$ for $V_{tx}$.

SUMMARY OF THE INVENTION

In accordance with my invention, I overcome the problems of the prior art by providing a memory cell using a split gate structure containing both a control gate and a floating gate in which the floating gate is self-aligned to the drain region. The control gate is not self-aligned. By "self-aligned" I mean that the portion of the transistor channel length under the floating gate will be defined by the floating gate itself regardless of any processing misalignments thereby insuring a constant channel length under the floating gate. To do this, a special process is employed wherein the floating gate is used to define one edge of the drain region. The source region is defined at the same time as the drain region but the alignment of the source region relative to the floating gate is not critical so long as the source region does not underlie and is spaced from the floating gate.

In a process in accordance with this invention, the diffused drain region (which also functions as a bit line and which corresponds to an elongated drain region of the type shown in the above-mentioned '565 patent) is formed using the floating gate to define one edge of the drain region. In the preferred embodiment, the drain and source regions are formed by ion implantation and one edge of the floating gate defines the lateral limit of one side of the drain region. A photoresist material partially extends over the floating gate in one direction and beyond the floating gate in the other direction and the source region is defined by an opening in the portion of this photoresist extending beyond the floating gate in the other direction. The result is to form a precisely defined channel portion $L_{eff}$ of the channel region beneath the floating gate and a remaining relatively imprecisely defined portion of the channel region (to be controlled by a to-be-formed control gate electrode which is part of the word line) underneath the photoresist between the other edge of the floating gate and the source region.

In accordance with my invention, any misalignment between the floating gate and the source region is covered by a to-be-formed control gate and has little effect on the operation of the memory cell while the floating gate is self-aligned to the drain region.

This invention will be understood in more detail in conjunction with the following drawings:

DETAILED DESCRIPTION

Figure 5A:
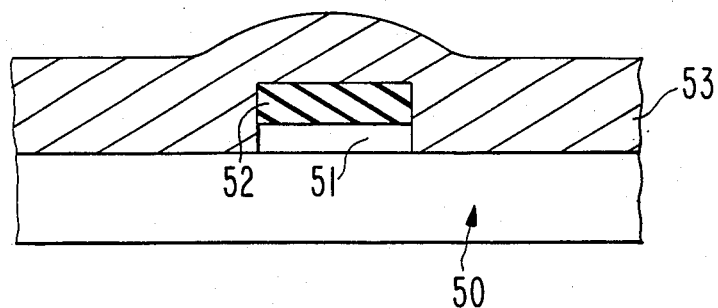
FIGS. 5a and 5b illustrate the novel process which I use to manufacture the novel self-aligned split gate structure of my invention.
Figure 5B:
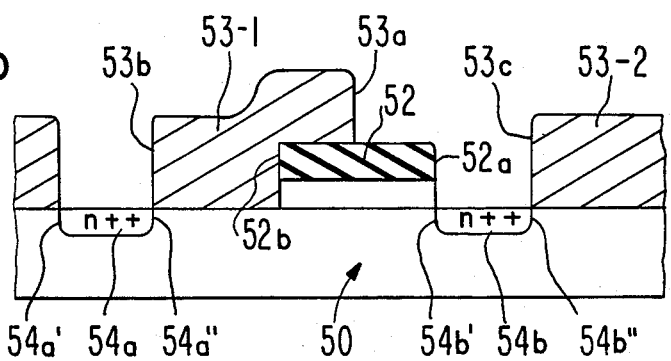

The following detailed description is meant to be illustrative only and not limiting. Other embodiments of this invention will be obvious to those skilled in the art in view of the following description. In FIGS. 5a and 5b, only the cross-section of a single memory cell or a portion thereof is shown while in FIG. 3 two cells and part of a third are shown in cross-section. It should be understood that a semiconductor integrated circuit memory made in accordance with this invention employs a plurality of such cells together with peripheral circuits for writing data into memory and for accessing the data stored in the memory. For simplicity these circuits are not shown.

The starting point for the process of my invention to yield my novel self-aligned split gate structure is the same as in the nonself-aligned split gate structure of the prior art and in particular of the '565 patent. Thus as shown in FIG. 5a a polycrystalline silicon substrate 50 typically having a resistivity of 10–50 ohm-centimeters has formed thereon in a standard manner a layer of gate oxide 51. Gate oxide 51, typically 300 angstroms thick, then has formed on it a first layer of polycrystalline silicon (often called "poly 1") which is patterned as shown in FIG. 5a to form a floating gate 52. The oxide 51 beneath the portions of polycrystalline silicon removed to form floating gate 52 is then removed by an etching process (typically a plasma etch) and a photoresist layer 53 is then formed over the top surface of the structure.

As shown in FIG. 5b, photoresist layer 53 is then patterned so that a particular segment 53-1 of photoresist is formed to partially overlie floating gate 52. Photoresist 53-1 has a right edge 53a which is formed to overlie the floating gate 52 somewhere near its middle and a left edge 53b which is formed to the left of left edge 52b of floating gate 52. The width of floating gate 52 is typically 1.5 to 2 microns and thus it is not difficult to ensure with sufficient certainty given typical tolerances in the manufacturing process that edge 53a is to the left of right edge 52a of floating gate 52 even for a reasonably expected worst case mask misalignment during the manufacturing process. It is also quite simple to insure that left edge 53b is sufficiently to the left of left edge 52b of floating gate 52 so that left edge 52b of floating gate 52 is never exposed, even in a worst case alignment mismatch of masks during manufacture. Thus the to-be-formed source 54a will always be laterally spaced from the left edge 52b of floating gate 52.

Following the formation of patterned photoresist 53-1 the structure is subjected to an ion implantation at a selected well-known dosage (typically $4 \times 10^{12}$ per cm$^2$) to form n++ drain region 54b and n++ source region 54a in the top surface of the semiconductor material 50. The region 54b has its left edge 54b' defined by the right edge 52a of floating gate 52 and its right edge 54b'' defined by the left edge 53c of patterned photoresist 53-2. The source region 54a has its right edge 54a''' defined by the left edge 53b of patterned photoresist 53-1. Thus the drain region 54b is self-aligned to the right edge 52a of floating gate 52. However, the right edge 54a'' of source region 54a is self-aligned to the left edge 53b of photoresist 53-1. The uncertainty in the location of left edge 53b of patterned photoresist 53-1 relative to left edge 52b of floating gate 52 represents an uncertainty in the length of the control gate channel (corresponding to channel portion 36b in FIG. 3) and not of the floating gate channel $L_{eff}$ (corresponding to channel portion 36a in the center cell of FIG. 3). By placing a proper voltage on the to-be-formed control gate, (corresponding to control gate 35 in FIG. 3), the channel length under the control gate becomes irrelevant and the conduction or nonconduction of the total channel is determined by the voltage placed on the floating gate 52 (corresponding to floating gate 33 in FIG. 3). Because floating gate 52 is uniformly coupled to drain 54b in all transistors in a memory array made in accordance with this invention and further because the effective channel length $L_{eff}$ (corresponding to channel 36a in FIG. 3) is substantially the same underneath all floating gates 52 in all transistors in a memory array formed in accordance with this invention, the structure of this invention yields a split gate programmable EPROM capable of being manufactured with much higher yield than the prior art EPROMs.

Figure 3:
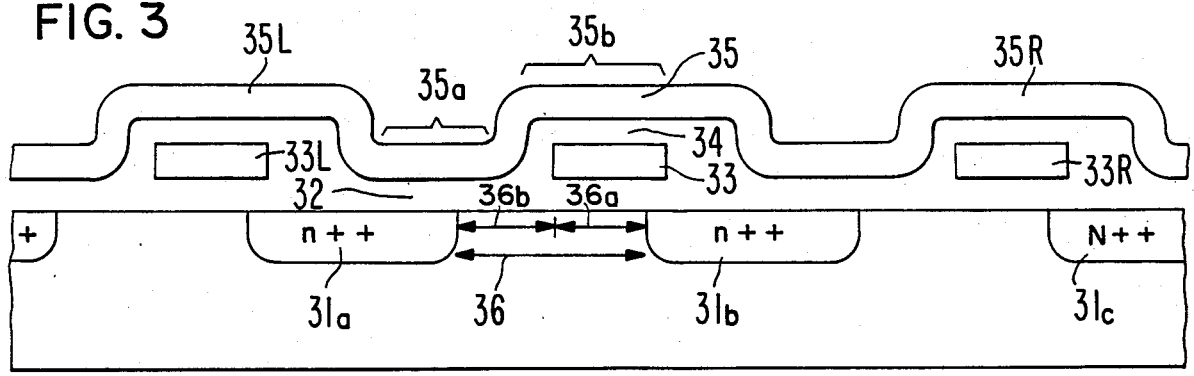
FIG. 3 illustrates the split gate structure of this invention wherein the floating gate is self-aligned to the drain region and overlies but is insulated from an accurately defined portion $L_{eff}$ of the channel region between the source and drain and the control gate overlies the floating gate and that portion of the channel region not overlain by the floating gate but is insulated therefrom.
Figure 4:
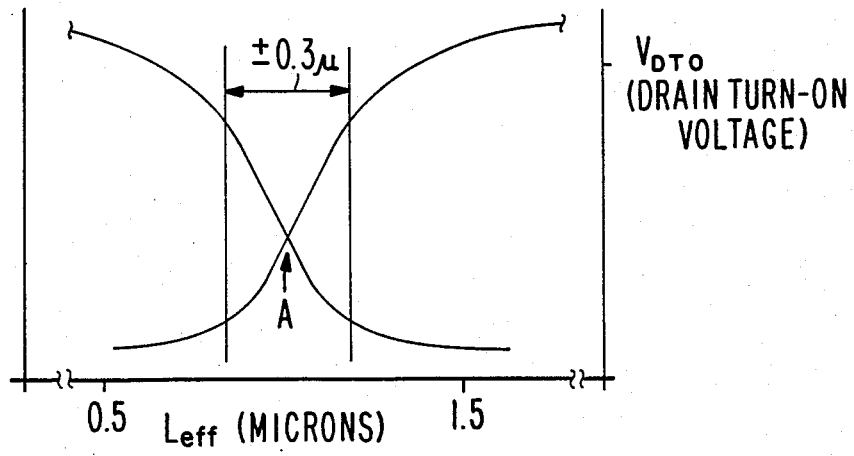
FIG. 4 illustrates the relationship between threshold voltage $V_{tx}$ and drain turn-on voltage $V_{DTO}$ for the structure of FIG. 1.

The remaining steps in the process are standard well known steps in the silicon gate EPROM technology. Insulation (not shown) is formed over floating gate 52. A control gate (often called "poly 2") corresponding to control gate 35 in FIG. 3 is formed, usually as part of a word line. The resulting structure appears as shown in FIG. 3. FIG. 3 shows floating gate 33 and floating gates 33L and 33R formed to the left and right of floating gate 33. All three floating gates have their right edges self-aligned to the left edges of the underlying drain regions in accordance with this invention. The drain region for a given cell doubles as the source region for the cell to the right.

The finished structure made by the process of this invention as illustrated in FIGS. 5a and 5b is shown in FIG. 3. In FIG. 3 the floating gate 33 has been formed prior to the formation of the source and drain regions 31a and 31b. The floating gate 33 is formed on a thin layer of insulation overlying a portion of the to-be-formed channel region between the source and drain. The right edge of the floating gate 33 has been used to define one edge of the drain region 31b. Overlying floating gate 33 is insulation 34 (typically silicon oxide) and overlying oxide 34 is the control gate 35. A portion 35a of control gate 35 overlies a second portion of the channel region between the left end of the floating gate 33 and the source region 31a. As described herein, the channel region 36b beneath portion 35a of control gate 35 can have a length 36b which varies substantially without affecting the performance of the device.

The structure shown in the central part of the cross-section in FIG. 3 is but one cell of a plurality of such cells. In a typical virtual ground structure the drain 31b for the cell shown in cross-section in FIG. 3 serves as the source for another cell located just to the right. Likewise the source 31a serves as the drain for a second cell located just to the left. The portions of the floating gates 33L and 33R associated with these adjacent cells are shown in FIG. 3.

Note that the floating gate 52 (FIGS. 5a and 5b) becomes capacitively coupled to drain region 54b by the lateral diffusion of left edge 54b' beneath floating gate 52 during further processing of the structure. This lateral diffusion is typically around 0.3 microns. However contrary to the prior art, the floating gate 52 is formed before the formation of the drain region 54b, rather than after, and is precisely self-aligned to one edge of the drain region 54b.

Figure 6A:
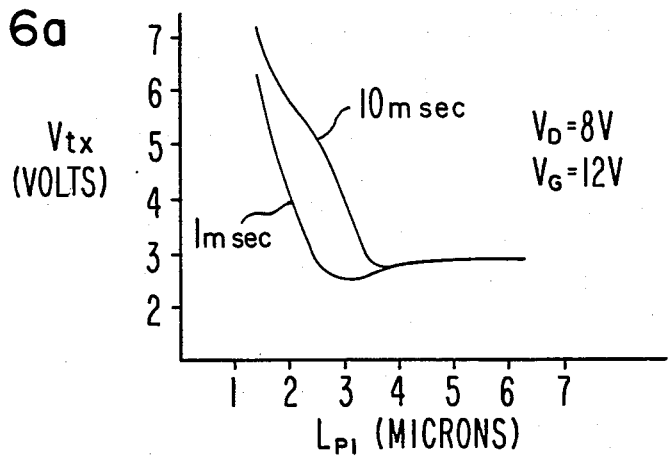
FIGS. 6a through 6d illustrate the effect of the channel length $L_{P1}$ under the floating gate on programming.

FIG. 6a illustrates the variation in threshold voltage versus the drain channel length ($L_{P1}$) of the floating gate ("poly 1"). In FIG. 6a the ordinate is the program threshold and the abscissa is the length of the floating gate channel $L_{P1}$ in microns. (Of importance, FIGS. 6a through 6d and 7a and 7b use drawn dimensions. However, the channel lengths 36a and 36b shown in FIG. 3 are the effective dimensions after processing. Thus channel length 36a is denoted $L_{eff}$ to represent the effective length of this channel after processing, while before processing this channel length is a drawn dimension and as such is denoted by the symbol $L_{P1}$. Accordingly, each of the dimensions $L_{P1}$ shown in FIGS. 6a through 6d and 7a and 7b must be corrected (i.e., reduced) by a given amount (approximately 0.5 microns), to reflect the effect of processing. Naturally the amount of the correction will vary with the processing.) The threshold voltage $V_{tx}$ obtained or programmed in a given time for a given drain voltage and gate voltage (corresponding in FIG. 6a to a drain voltage of 8 volts and a gate voltage of 12 volts) drops rapidly as, the length of the channel $L_{P1}$ under the floating gate 52 (FIG. 5b) increases to a minimum $V_{tx}$ of about 2.5 volts for $L_{P1}$ of somewhere between 3 to 4 microns and then increases slightly. This minimum $V_{tx}$ corresponds to the initial device threshold before programming. The threshold $V_{tx}$ represents the voltage which must be applied to the control gate (such as gate 35 in FIG. 3) to turn on the transistor beneath the control gate as shown in FIG. 3 when the cell containing that transistor has been programmed. Thus as the length of the channel 36a underneath the floating gate 33 increases (FIG. 3) the threshold voltage necessary to turn on the transistor and create a channel from the source region 31b to the drain 31a decreases. As is shown in FIG. 6a, both 1 millisecond and 10 millisecond programming times yield substantially the same shaped curve.

Figure 6B:
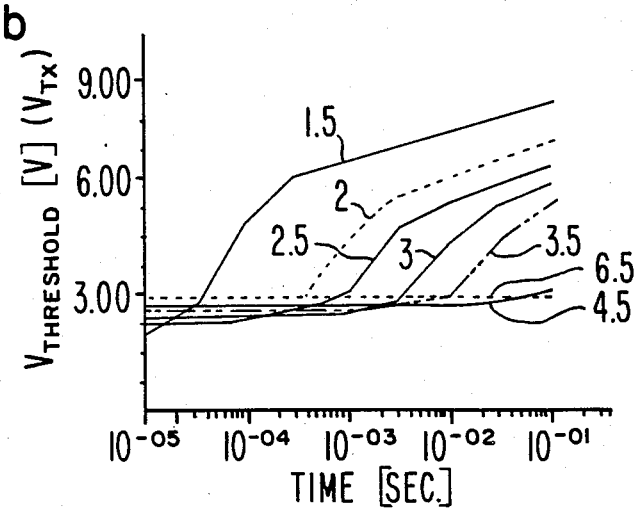

FIG. 6b illustrates the effect of the length of the channel 36a underneath floating gate 33 on the threshold voltage (ordinate) versus programming time (abscissa). The various curves reflect different lengths $L_{P1}$ of the channel 36a (FIG. 3) beneath floating gate 33 in microns. As these channel lengths increase, the threshold voltage for a given programming time drops. Thus for a programming time of $10^{-2}$ seconds, the threshold voltage for a 1.5 micron channel length $L_{P1}$ is approximately 7 volts whereas the threshold voltage for a 3.0 micron channel $L_{P1}$ is about 4 volts. These curves were obtained for a voltage $V_{DS}$ from the drain to the source of 8 volts and a voltage on the control gate 35 of 12 volts. The curves of FIG. 6b illustrate that the shorter the floating gate the stronger the field which is formed and therefore the greater the number of electrons which are placed on the floating gate thereby resulting in a larger threshold voltage $V_{tx}$ to turn on the transistor.

Figure 6C:
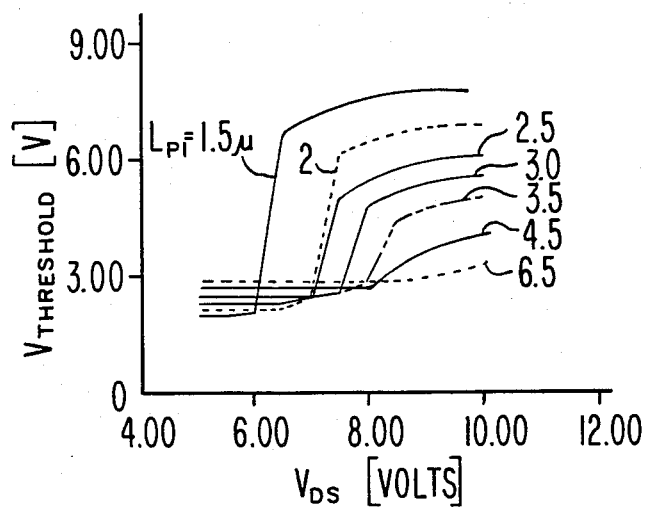

FIG. 6c is a plot of threshold voltage $V_{tx}$ (ordinate) versus the voltage on the drain 31b (FIG. 3) with the length of channel 36a beneath floating gate 33 as the parameter on the various curves. For a given drain voltage $V_D$ (for example 8 volts) the threshold voltage $V_{tx}$ goes up as the length $L_{P1}$ of the channel 36a beneath floating gate 33 goes down. The curves of FIG. 6c were taken with a control channel $L_{P2}$ (corresponding to the drawn dimension of channel 36b in FIG. 3) beneath the control gate 35 of 2.5 microns, a gate voltage on control gate 35 of 12 volts and a programming time of 10 milliseconds ($10^{-2}$ seconds). These curves illustrate that once a given drain voltage difference $V_{DS}$ is achieved between the drain and the source, increasing the drain voltage beyond a given amount has substantially little effect on the threshold voltage $V_{tx}$ of the transistor. In other words, $\Delta V_{tx}/\Delta V_{DS}$ becomes substantially zero thereby showing that increasing the drain voltage coupled to the floating gate has little effect on the programming of the transistor. Thus after the program threshold voltage $V_{tx}$ is reached, increasing the drain to source voltage $V_{DS}$ does not achieve any significant improvement in performance.

As $L_{P1}$ increases, the threshold voltage $V_{tx}$ at which $\Delta V_{tx}$ over $\Delta V_{DS}$ becomes very small decreases. So increasing $V_{DS}$ does even less for structures with longer floating gates.

In FIG. 6c each consecutive point on a given line for a given $L_{P1}$ represents an additional 10 milliseconds of programming time rather than just 10 milliseconds of programming time. Accordingly the curves for $V_{tx}$ versus $V_{DS}$ in FIG. 6c would be even flatter than shown in FIG. 6c if a constant programming time was applied to program the cell from different $V_{DS}$ start points.

Figure 6D:
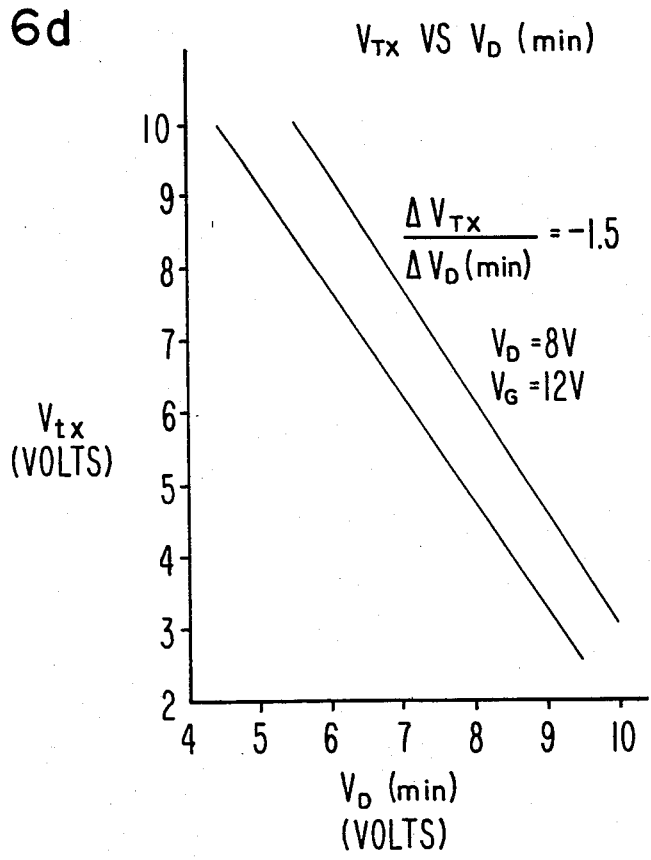

FIG. 6d illustrates the very tight predictability of threshold voltage $V_{tx}$ versus $V_D$ (min) for the structure of this invention. $V_D$ (min) is defined as the minimum $V_{DS}$ needed to start programming (i.e., to start efficient electron flow onto the floating gate). In FIG. 6c $V_D$(min) is the $V_{DS}$ at which the curve shows a break point sharply to the right. This break point or "knee" corresponds to the $V_D$(min) plotted in FIG. 6d.

The relationship of FIG. 6d to FIG. 6c illustrates a basic point of my invention. In a 256K EPROM the time to program the cells in the EPROM theoretically equals 256K times the time to program each cell divided by 8 (ROMs are programmed one byte at a time). Therefore, if the programming time of each cell can be significantly reduced, the efficiency of programming a large number of EPROMs can be proportionally increased. I have discovered that to program to a given threshold voltage $V_{tx}$ in a given programming time, the key is to control the length of $L_{P1}$ and in particular to make this length (which is related to the channel 36a in FIG. 3) as small as practical without generating punch-through from the source to the drain. As shown by analysis of FIG. 6d, the threshold voltage $V_{tx}$ is increased for a given programming time by decreasing $V_D$(min). As shown in FIG. 6c $V_D$(min) decreases as $L_{P1}$ decreases in length. Accordingly, decreasing $L_{P1}$ is the key to programming to a given threshold voltage $V_{tx}$ in a given time. My invention not only allows a small effective channel length $L_{eff}$ to be achieved beneath the floating gate but allows this channel length to be achieved in a controllable and reproducible manner throughout an EPROM array thereby to obtain repeatable and consistent results throughout the array.

Figure 1:
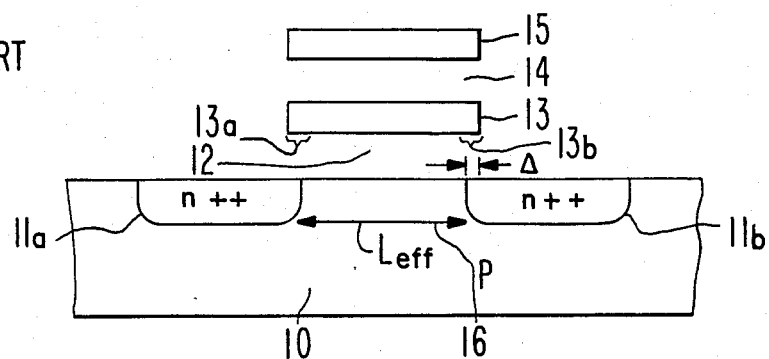
FIG. 1 illustrates a prior art EPROM using a single floating beneath the control gate.
Figure 2:
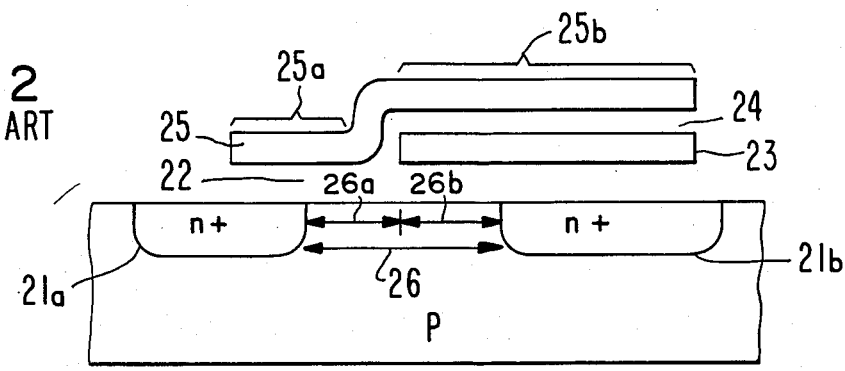
FIG. 2 illustrates the split gate structure of the prior art wherein the floating gate is not self-aligned to the drain region and the control gate is formed over part of the channel region.
Figure 7A:
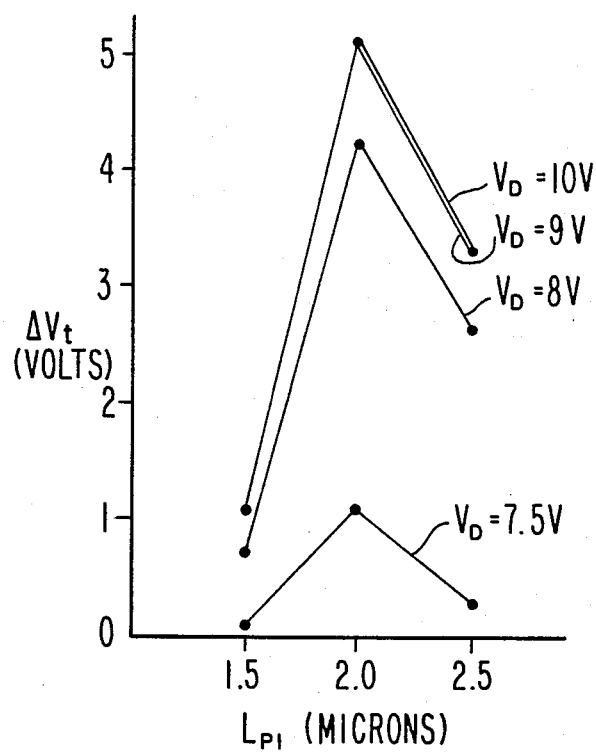
FIGS. 7a and 7b show the tight envelope of operation for the nonself-aligned structure and illustrate graphically the advantages of my self-aligned split gate structure.

FIG. 7a illustrates change of threshold voltage, $\Delta V_T$ for three different $L_{P1}$ (i.e., three different drawn channel lengths beneath the floating gate) for the structure shown in FIG. 2. In a nonself-aligned structure, the proper length of the channel under the floating gate is crucial to achieve maximum threshold voltage $V_{tx}$. As shown in FIG. 7a if the channel length 36a becomes too short (for example, 1.5 microns), then punch-through occurs between the source 31a and drain 31b during programming resulting in a failure to program the device. The proper alignment of a floating gate in the nonself-aligned structure to optimize the length of the channel 36a beneath the floating gate 33 and the overlap of the floating gate to drain is crucial. The very sharp peak in FIG. 7a reflects the variation in $V_{tx}$ with channel length $L_{P1}$. FIG. 7a shows that to optimize the device for the minimum channel length $L_{P1}$ in terms of programming efficiency results in a lower initial threshold before programming and higher final threshold after programming so as to obtain a higher read current. This means a lower impedance in the circuit which in turn means that during read a capacitor in the sense amplifier in the peripheral circuitry of the memory discharges faster through a programmed transistor than otherwise would be the case resulting in shorter access time.

Three effective channels beneath the floating gate (1.5 micron, 2.0 micron and 2.5 micron) are shown in FIG. 7a. The parameter $\Delta V_T$ (representing the change in threshold voltage as a function of different channel length) is illustrated by the curves. This change in voltage is particularly pronounced as one goes from 1.5 to 2 to 2.5 micron length for $L_{P1}$. The change in $V_{tx}$ as a function of channel length is similar to that shown in FIG. 6a for the self-aligned structure of my invention. However, as one goes from a 2 micron $L_{P1}$ to 1.5 micron $L_{P1}$ and shorter, a new phenomenon appears reflecting possible punch through from the source to the drain and $V_{tx}$ thus is lower than would be expected. The nonself-aligned curve shows that a proper $L_{P1}$ is critical to obtaining a predicted threshold voltage. However, with nonself-aligned floating gate technology $L_{P1}$ can vary even across a given chip causing a variation in $V_{tx}$ from cell to cell within a given memory. Often this variation is unacceptable. As can be seen by the curves of FIG. 7a, a given memory can have $L_{P1}$ from cell to cell varying for example from 1.5 microns all the way to 2.5 microns or greater because of misalignment in the masking during the processing of the wafer. Accordingly, $V_{tx}$ is unpredictably variable across the wafer often resulting in unacceptable performance.

Figure 7B:
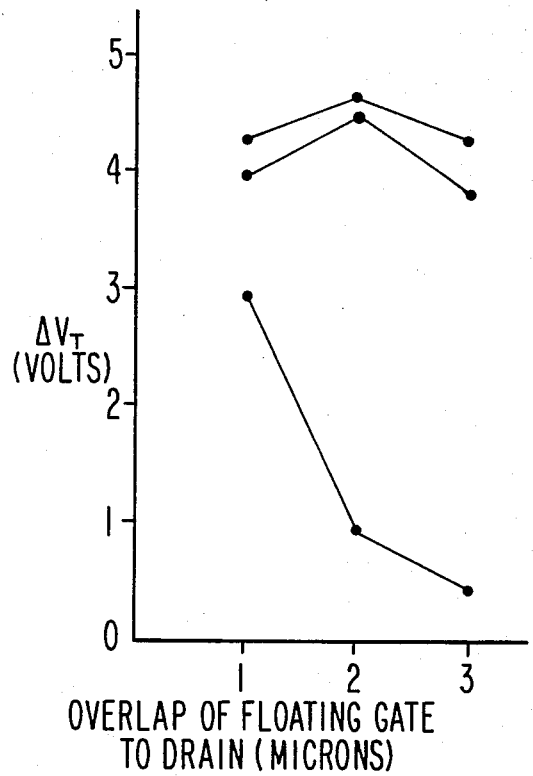

FIG. 7b shows the effect of overlap and $V_D$ on threshold voltage. For the nonself-aligned device the structure must be aligned so that the 3 sigma worst case of alignment gives a satisfactory channel length 36a beneath floating gate 33. Increasing the coupling between the floating gate and the drain does not improve the threshold voltage of the device for given programming conditions so overlapping the drain with the drain does not help. The more overlap of the floating gate to the drain means the more electrons required to charge the floating gate for a given channel length 36a beneath the floating gate. So instead of improving the efficiency of the device, increasing the overlap of the floating gate to the drain actually decreases this efficiency. A minimum overlap of the floating gate to the drain is needed to insure that accelerated electrons hit and lodge in the floating gate rather than in the control gate or the word line.

FIG. 7b shows that as the overlap of the nonself-aligned structure increases, the $\Delta V_T$ actually declines for a given $V_D$. Again, this shows that the coupling between the drain and the floating gate is not helpful to achieving a desired $V_{tx}$ and indeed can even be harmful.

The circuit of this invention is highly scaleable and retains its self-aligned character as it is scaled.

An important effect of this invention is that by choosing the correct $L_{P1}$ the programming time for a memory array can be substantially reduced. For example, a prior art 256K EPROM takes approximately 150 seconds or 2½ minutes to program. A 256K EPROM using the structure of this invention can be programmed in approximately 30 seconds. This is a substantial improvement resulting in lower programming costs and lower test costs.

An additional advantage flowing from this invention is that the uncertainty in the location of the floating gate due to mask alignment tolerances is substantially reduced compared to the uncertainty in the location of the floating gate in the prior art nonself-aligned structure and in the standard prior art EPROM (nonsplit gate but self-aligned). Table I illustrates this improvement with respect to the self-aligned split gate structure of this invention compared to the standard non-split gate self-aligned structure of the prior art.

TABLE I

|  | Standard EPROM (Non-split but self-aligned gate) | Self-aligned split gate structure this invention |
|---|---|---|
| STEP 1 | Poly 1 (Floating gate) Critical dimension not defined but non-critical dimensions are defined | Poly 1 (Floating gate) Critical dimension defined |
| STEP 2 | Poly 2 (Control gate) Define critical dimensions of control gate - Accuracy degraded because of rough, non-planar topology associated with two layers of polycrystaline silicon | |
| STEP 3 | Poly 1 critical dimension defined using Poly 2 as a mask | |

Table I compares only the critical steps in the two processes used to define the floating gate and thus the crucial channel length $L_{eff}$. $L_{eff}$ is the important channel length in the self-aligned split gate structure of this invention and in any EPROM structure. Note that in a standard non-split gate self-aligned structure $L_{eff}$ is the total channel length between the source and drain.

As shown in Table I three steps are required to define the critical dimension of the floating gate in the standard non-split gate self-aligned structure. In the first step only the noncritical dimensions corresponding to the width (but not the length) of the channel beneath the floating gate are defined. The critical dimensions of the floating gate corresponding to the channel length beneath the floating gate are not defined. In step 2 the second layer polycrystalline silicon from which the control gate will be fabricated is deposited. The critical dimension of this second layer (known as "poly 2") is defined in step 2. This dimension corresponds to the channel length between the to-be-formed source and drain regions. However, the accuracy with which the critical dimension of the control gate is fabricated is degraded because of the rough nonplanar topology associated with the two layers of polycrystalline silicon deposited on the wafer. In the third step the first layer of polycrystalline silicon (poly 1) has its critical dimension (corresponding to channel length $L_{P1}$) defined using the second layer of polycrystalline silicon as a mask. Again, the accuracy with which the critical dimension of the first layer of polycrystalline silicon is defined is degraded due to the uneven topology of the structure.

In contrast, the self-aligned split gate structure of my invention defines the critical dimension of the poly 1 floating gate layer in step 1.

As the above comparison shows, the channel length $L_{P1}$ for the standard nonsplit gate self-aligned structure is equal to the drawn length of the channel plus or minus the uncertainty in the critical dimension associated with the poly 2 definition step plus or minus the uncertainty introduced in the critical dimension of the channel length associated with poly 1 using poly 2 as a mask. Thus the uncertainty in the effective channel length in the standard nonsplit gate self-aligned structure has two components introduced by two critical dimensions. On the other hand, using the self-aligned split gate structure of my invention, only one uncertainty in a critical dimension occurs and that occurs in the first step where the poly 1 critical dimension is defined and the topology is smooth. Accordingly my invention yields a double processing advantage over the process by which the standard non-split gate self-aligned structure of the prior art is made by eliminating one critical dimension in defining $L_{eff}$ and by introducing a much smoother topology during the formation of the critical channel length $L_{eff}$.

Table II compares the critical steps required to define the poly 1 floating gate in the nonself-aligned split gate structure of the prior art compared to the single step required to define the floating gate in the self-aligned split gate structure of my invention.

TABLE II

|        | Nonself-aligned split gate | Self-aligned split gate of this invention |
|--------|----------------------------|-------------------------------------------|
| STEP 1 | Source and Drain Implanted | Poly 1 (Floating Gate) Define critical dimension |
| STEP 2 | Poly 1 (Floating Gate) Define critical dimension | |

Step 1 in fabricating the prior art nonself-aligned split gate structure is to implant the source and drain regions in the device. Step 2 is then to deposit the poly 1 layer and then form the floating gate from this layer. The critical dimension $L_{P1}$ is defined by this step. Unfortunately, uncertainty in the length of $L_{P1}$ results from the uncertainty in the critical dimension of the poly 1 plus or minus the misalignment of the mask used to define the critical dimension of the floating gate relative to the underlying drain region. Typically the uncertainty in the critical dimension is ±0.3 microns while the uncertainty due to the mask misalignment is ±0.6 microns. When combined in a statistical sense (root mean square) the total uncertainty in $L_{P1}$ can be ±0.6 or ±0.7 microns. To the contrary, using the self-aligned split gate structure of my invention, the critical dimension of the poly 1 floating gate is defined with an uncertainty at most of about ±0.3 microns. Accordingly, my invention achieves a substantial improvement in manufacturing accuracy over the prior art nonself-aligned split gate structure.

Figure 8:
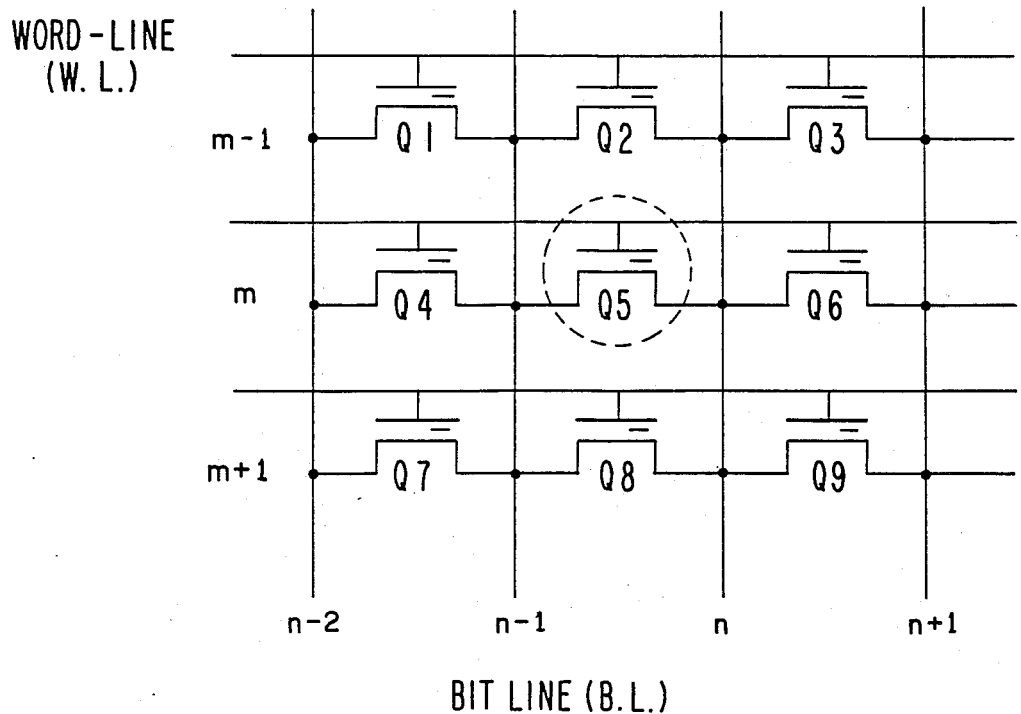
FIG. 8 shows in schematic form a memory array formed using the self-aligned split gate structure of my invention.

FIG. 8 illustrates an EPROM array fabricated using the self-aligned split gate structure of my invention. For simplicity, an array of nine (9) transistors or cells is shown. The programming and reading of cell or transistor Q5 will be described. Note that the array comprises word line rows m−1, m and m+1 and bit line columns n−2, n−1, n and n+1. Column n−2 is the source of transistors Q1, Q4 and Q7 while column n−1 is the drain of transistors Q1, Q4, and Q7 and the source of transistors Q2, Q5 and Q8. Similarly, column n is the drain of transistors Q2, Q5 and Q8 and the source of transistors Q3, Q6 and Q9. Column n+1 is the drain of transistors Q3, Q6 and Q9.

In operation, to read device m, n (i.e. cell Q5) all bit lines except n−1 are set at 2 volts. Bit line n−1 is set at ground. Word line m is set at 5 volts while all other word lines except m are set at ground.

To program device m,n (i.e., cell Q5) all bit lines except n are set at ground while bit line n is set at 8 or 9 volts. All word lines except m are set at ground while word line m is set at 12 volts. During programming, device m, n+1 (i.e., cell Q6) is also in programming conditions but in the reverse configuration (i.e., the high voltage is applied away from the floating gate). In this configuration there is no programming of m, n+1). This asymmetry in the split gate EPROM is what enables one to utilize the virtual ground approach.

While one embodiment of this invention has been described, other embodiments of this invention will be obvious to those skilled in the semiconductor arts in view of this disclosure.

What is claimed is:

1. A self-aligned split gate single transistor memory cell for a programmable read only memory comprising
a semiconductor substrate containing a source region and a drain region separated by a channel region;
a floating gate formed over but insulated from a first portion of the channel region, a first edge of the floating gate being aligned with and used to define one edge of said drain region and a second edge of said floating gate being over said channel region and separated from the closest edge of said source region by a second portion of said channel region; and
a control gate formed over but insulated from said floating gate and formed over but insulated from said second portion of said channel region.

2. Structure as in claim 1 wherein that portion of said control gate overlying said second portion of said channel region is separated from the second portion of said channel region by insulation of approximately the same thickness as the insulation separating said floating gate from said first portion of said channel region.

3. Structure as in claim 1 wherein the minimum length of said second portion of said channel region from said source region to said floating gate is a function of the alignment tolerances on the manufacturing process used to make said memory cell and wherein the length of said second portion of said channel can vary by substantial amounts without affecting the performance of said cell.

4. Structure as in claim 3 wherein the length of said second portion of said channel region can vary by in excess of 1 micron without substantially affecting the performance of the memory cell.

5. Structure as in claim 1 wherein said floating gate has a portion which extends over a portion of said drain due to the lateral diffusion of said drain region under said floating gate during the processing of said memory cell after the formation of said drain region.

6. Structure as in claim 1 wherein said single transistor memory cell is part of an array of such cells each cell having approximately the same effective channel length underneath its floating gate.

7. Structure as in claim 1 wherein said floating gate is formed prior to the drain region and the drain region is then formed using one edge of the floating gate to define one edge of the drain region.

* * * * *

UNITED STATES PATENT AND TRADEMARK OFFICE
CERTIFICATE OF CORRECTION

PATENT NO. : 4,639,893

DATED : January 27, 1987

INVENTOR(S) : Boaz Eitan

It is certified that error appears in the above-identified patent and that said Letters Patent is hereby corrected as shown below:

Column 4, line 68, delete "polycrystalline".

Signed and Sealed this

Twentieth Day of November, 1990

Attest:

HARRY F. MANBECK, JR.

Attesting Officer

Commissioner of Patents and Trademarks